United States Patent
Cabral, Jr. et al.

(10) Patent No.: US 9,691,656 B2
(45) Date of Patent: Jun. 27, 2017

(54) SELF-FORMING EMBEDDED DIFFUSION BARRIERS

(71) Applicant: International Business Machines Corporation, Armonk, NY (US)

(72) Inventors: Cyril Cabral, Jr., Mahopac, NY (US); Daniel C. Edelstein, White Plains, NY (US); Juntao Li, Cohoes, NY (US); Takeshi Nogami, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/817,868

(22) Filed: Aug. 4, 2015

(65) Prior Publication Data

US 2015/0340323 A1 Nov. 26, 2015

Related U.S. Application Data

(63) Continuation of application No. 13/858,125, filed on Apr. 8, 2013, now Pat. No. 9,190,321.

(51) Int. Cl.
*H01L 23/532* (2006.01)
*H01L 21/768* (2006.01)
*H01L 23/528* (2006.01)

(52) U.S. Cl.
CPC .. *H01L 21/76846* (2013.01); *H01L 21/76831* (2013.01); *H01L 21/76843* (2013.01);
(Continued)

(58) Field of Classification Search
CPC ......... H01L 21/76846; H01L 23/53295; H01L 23/53238; H01L 23/53233;
(Continued)

(56) References Cited

U.S. PATENT DOCUMENTS 6,727,177 B1  4/2004  Catabay et al.
7,304,384 B2  12/2007  Koike et al.
(Continued)

OTHER PUBLICATIONS

Wojcik et al., "Electrical evaluation of PVD RuTa(N), RuW(N) and RuMn films as Cu diffusion barriers," Advanced Metallization Conference, Albany, NY, USA, Oct. 6, 2010, 24 pages.
(Continued)

*Primary Examiner* — Joshua King
*Assistant Examiner* — Mohammed R Alam
(74) *Attorney, Agent, or Firm* — Erik K. Johnson

(57) ABSTRACT

Interconnect structures containing metal oxide embedded diffusion barriers and methods of forming the same. Interconnect structures may include an $M_x$ level including an $M_x$ metal in an $M_x$ dielectric, an $M_{x+1}$ level above the $M_x$ level including an $M_{x+1}$ metal in an $M_{x+1}$ dielectric, an embedded diffusion barrier adjacent to the $M_{x+1}$ dielectric; and a seed alloy region adjacent to the $M_{x+1}$ metal separating the $M_x$ metal from the $M_{x+1}$ metal. The embedded diffusion barrier may include a barrier-forming material such as manganese, aluminum, titanium, or some combination thereof. The seed alloy region may include a seed material such as cobalt, ruthenium, or some combination thereof.

5 Claims, 7 Drawing Sheets

(52) U.S. Cl.
CPC .. *H01L 21/76855* (2013.01); *H01L 21/76858* (2013.01); *H01L 21/76867* (2013.01); *H01L 21/76871* (2013.01); *H01L 23/528* (2013.01); *H01L 23/53223* (2013.01); *H01L 23/53233* (2013.01); *H01L 23/53238* (2013.01); *H01L 23/53266* (2013.01); *H01L 23/53295* (2013.01); *H01L 2924/0002* (2013.01)

(58) Field of Classification Search
CPC ......... H01L 23/53223; H01L 23/53266; H01L 2924/0002; H01L 21/76841; H01L 28/75
See application file for complete search history.

(56) References Cited

U.S. PATENT DOCUMENTS

| | | |
|---|---|---|
| 7,727,883 B2 | 6/2010 | Ishizaka et al. |
| 8,112,885 B2 | 2/2012 | Koike et al. |
| 8,188,599 B2 | 5/2012 | Koike |
| 8,198,730 B2 | 6/2012 | Tagami et al. |
| 8,258,626 B2 | 9/2012 | Koike et al. |
| 8,372,745 B2 | 2/2013 | Koike |
| 2007/0216031 A1 | 9/2007 | Yang et al. |
| 2008/0057704 A1 | 3/2008 | Koike et al. |
| 2008/0179747 A1* | 7/2008 | Sakai ................ H01L 21/76805 257/751 |
| 2008/0280151 A1* | 11/2008 | Jourdan ............ H01L 21/76831 428/450 |
| 2009/0121355 A1 | 5/2009 | Haneda et al. |
| 2009/0134520 A1 | 5/2009 | Bright et al. |
| 2009/0152736 A1 | 6/2009 | Watanabe et al. |
| 2009/0181164 A1 | 7/2009 | Wang et al. |
| 2010/0099251 A1* | 4/2010 | Fu ..................... H01L 21/76814 438/653 |
| 2010/0155951 A1 | 6/2010 | Koike et al. |
| 2010/0200991 A1 | 8/2010 | Akolkar et al. |
| 2011/0101529 A1 | 5/2011 | Kao et al. |
| 2011/0163451 A1 | 7/2011 | Matsumoto et al. |
| 2012/0061838 A1 | 3/2012 | Edelstein et al. |
| 2012/0074571 A1 | 3/2012 | Lavoie |
| 2012/0077053 A1 | 3/2012 | Akolkar et al. |

OTHER PUBLICATIONS

Cabral, Jr. et al., "Self-Forming Embedded Diffusion Barriers," U.S. Appl. No. 13/858,125, filed Apr. 8, 2013, 28 pages.

* cited by examiner

SELF-FORMING EMBEDDED DIFFUSION BARRIERS

CROSS REFERENCE TO RELATED APPLICATION

This application is a Continuation Application of pending U.S. patent application Ser. No. 13/858,125 filed Apr. 8, 2013.

BACKGROUND

The present invention generally relates to metal interconnect structures, and particularly to self-forming diffusion barriers.

Metal interconnect structures are the primary means of connecting microelectronic devices. Such interconnect structures typically take the shape of wires, trenches, or vias formed in dielectric layers above the microelectronic devices and may typically be formed by depositing a dielectric layer, etching a trench in the dielectric layer and filling the trench with metal. To prevent electromigration of the metal within the trench and to prevent material from the metal and the dielectric from diffusing into each other, a liner may be deposited into the trench prior to filling the trench with metal. Typically, this liner consists of a layer of tantalum, tantalum nitride, or both; though other liner materials are known in the art.

However, as the dimensions of microelectronic devices continue to shrink, smaller interconnect structures are also required. As the interconnect structures shrink, the thickness of the liner becomes increasingly problematic, as it takes up a proportionally greater volume of the trench. Because the volume of metal in the trench is reduced, the resistance of the interconnect structure increases, subsequently decreasing overall device performance. Ultimately the interconnect structure may become so small that it is not possible to effectively deposit the liner in the trench, rendering the device inoperable. Therefore, a means of forming a diffusion barrier that maximizes the metal volume within the trench is desirable.

BRIEF SUMMARY

The present invention relates to interconnect structures including embedded diffusion barriers and methods of forming the same. According to an exemplary embodiment, the interconnect structure may include: an $M_x$ level including an $M_x$ metal in an $M_x$ dielectric; an $M_{x+1}$ level above the $M_x$ level including an $M_{x+1}$ metal in an $M_{x+1}$ dielectric; an embedded diffusion barrier adjacent to the $M_{x+1}$ dielectric; and a seed alloy region adjacent to the $M_{x+1}$ metal. The embedded diffusion barrier may include a metal such as manganese, aluminum, titanium, or some combination thereof. The seed alloy region may include a seed material such as cobalt, ruthenium, or some combination thereof.

According to another exemplary embodiment, an embedded diffusion barrier may be formed by: providing an interconnect structure comprising an $M_x$ level including an $M_x$ metal in an $M_x$ dielectric and an $M_{x+1}$ level including a trench in an $M_{x+1}$ dielectric above the $M_x$ level; forming a main liner in the trench including a seed material and a barrier-forming material; substantially filling the trench with an $M_{x+1}$ metal separated from the $M_{x+1}$ dielectric by the main liner; and annealing the $M_{x+1}$ level to cause the barrier-forming material to migrate into the $M_{x+1}$ dielectric.

According to another exemplary embodiment, an embedded diffusion barrier may be formed by: providing an interconnect structure comprising an $M_x$ level including an $M_{x+1}$ metal in an $M_x$ dielectric and an $M_{x+1}$ level including a trench in an $M_{x+1}$ dielectric above the $M_x$ level; forming a seed material in the trench, forming a metal liner including a barrier-forming material and a conductive interconnect material above the seed material, forming an $M_{x+1}$ metal above the metal liner; and annealing the $M_{x+1}$ level to cause the barrier-forming material to migrate into the $M_{x+1}$ dielectric.

In another embodiment of the present invention, a seed material (e.g., cobalt, ruthenium or combinations thereof) is formed directly on an opening in a dielectric layer, or on a thin liner layer (e.g., titanium, titanium nitride, tantalum, tantalum nitride, silicon nitride, SiCNOH) on the dielectric. A barrier forming material may then be deposited alone (e.g., manganese, aluminum, or titanium) or in combination with a conductor. (e.g., a copper-manganese, copper-aluminum, or copper-titanium alloy). The dielectric opening may then be filled with a bulk interconnect conductor (e.g., copper). During or after the filling of the opening, the structure may be heated. The heating may cause the barrier forming material to diffuse through the seed material and thin liner, if present, into the dielectric layer, thereby forming a metal oxide layer which serves as a diffusion barrier. In addition, an alloy of the barrier material may form with the seed material. Thus, a metal interconnect may be formed having a bulk conductor (e.g., copper), a seed alloy layer (e.g., seed material [e.g., cobalt or ruthenium] optionally alloyed with barrier material [e.g., manganese, aluminum, or titanium], and/or bulk conductor [e.g., copper]), an optional thin liner layer (e.g., titanium, tantalum, or other thin liner) and metal oxide (including, e.g., barrier forming material [e.g., manganese, aluminum, or titanium] and oxygen).

An advantage of an embodiment of the present invention is that the seed material can be deposited on top of porous low-k materials in conformal and continuous layers.

A further advantage of an embodiment of the present invention is that the seed material limits diffusion of the bulk interconnect conductor so that the barrier-forming material may form a metal oxide embedded diffusion barrier prior to the bulk interconnect conductor reaching the dielectric.

A further advantage of an embodiment of the present invention is that the seed material creates a strong interface between the bulk interconnect conductor and the various sidewall materials, such that electromigration resistance is improved by removing a pathway for atoms and void movement.

A further advantage of an embodiment of the present invention is that the diffusion barrier material alone or in combination with a bulk interconnect conductor alloy can be deposited over the seed material in a conformal manner, thus giving good fill. In addition, when using the bulk interconnect conductor alloy, reflow can be used to further improve gap fill.

A further advantage of an embodiment of the present invention is that a short length effect of electromigration can be utilized through the bottom of the via because of the presence of the seed material at the via bottom where it connects the underlying metal of the preceding interconnect level.

A further advantage of an embodiment of the present invention is that any excess barrier-forming material may migrate to the top of the interconnect level, forming a layer containing the excess barrier-forming material which improves electromigration resistance.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which.

Figure 1:
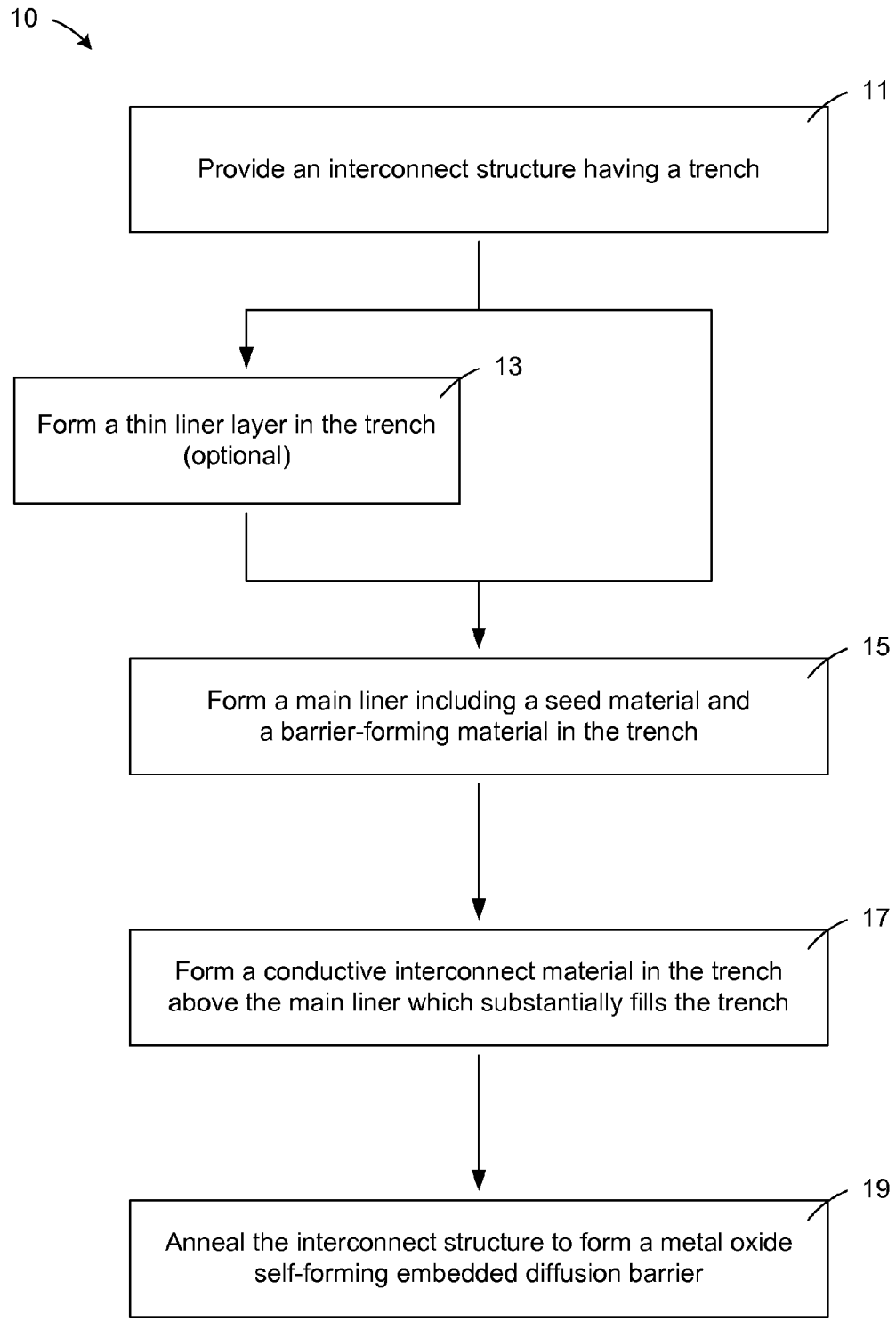
FIG. 1 is a flow chart of a method of creating a self-forming diffusion barrier, according to an exemplary embodiment of the present invention.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments will now be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Embodiments of the invention generally relate to methods of forming an embedded diffusion barrier and a metal liner adjacent to the metal structures of interconnect levels by depositing a seed material and a barrier-forming material adjacent to the boundary of a metal structure of a back-end-of-the-line (BEOL) interconnect level. By then annealing the BEOL interconnect level, the barrier-forming material may diffuse through the seed material into a dielectric layer of the BEOL interconnect level adjacent to the metal structure. A reaction between material of the dielectric layer and the barrier-forming material may result in the formation of an embedded diffusion barrier between the dielectric layer and the metal structure. The embedded diffusion barrier may be made of a self-forming metal oxide capable of preventing material from diffusing from the dielectric layer into the metal structure, and vice versa.

FIG. 1 is a flow chart of a method of forming an embedded diffusion barrier, according to an embodiment of the present invention. Referring to FIG. 1, the method 10 includes a step 11, providing an interconnect structure having a trench; an optional step 13, forming a thin liner layer in the trench; a step 15 forming a main liner including a seed material and barrier-forming material in the trench; a step 17 forming a conductive interconnect material in the trench above the main liner which substantially fills the trench; and a step 19, annealing the interconnect structure to form a metal oxide self-forming embedded diffusion barrier. Steps of the method embodied in FIG. 1 are depicted in FIGS. 2A-2D.

Figure 2A:
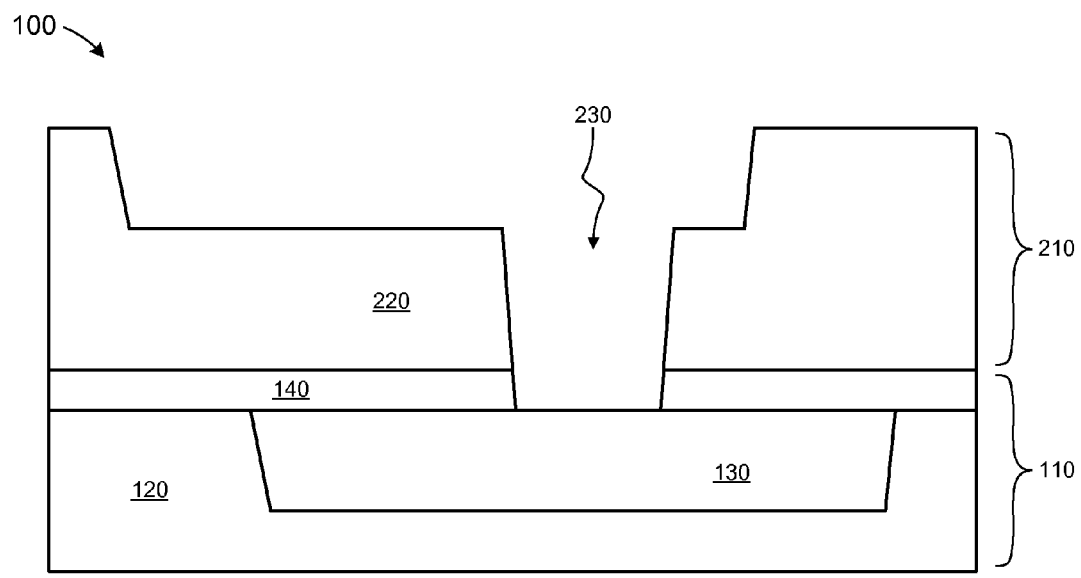
FIG. 2A is a cross-sectional view of an interconnect structure having an $M_x$ level and an $M_{x+1}$ level including a trench in an $M_{x+1}$ dielectric layer, according to an exemplary embodiment of the present invention.

At 11, described in conjunction with FIG. 2A, an interconnect structure 100 may be provided. The interconnect structure 100 may include an $M_x$ level 110 and an $M_{x+1}$ level 210. The $M_x$ level 110 and the $M_{x+1}$ level 210 may be any adjacent interconnect levels in the interconnect structure 100. The $M_x$ level 110 may include an $M_x$ dielectric 120, an $M_x$ metal 130, and an $M_x$ capping layer 140. The $M_{x+1}$ level 210 may include an $M_{x+1}$ dielectric 220 and a trench 230 in the $M_{x+1}$ dielectric 220.

With continued reference to FIG. 2A, the $M_x$ dielectric 120 and the $M_{x+1}$ dielectric 220 may include any suitable dielectric material, for example, silicon oxide, silicon nitride, hydrogenated silicon carbon oxide, silicon based low-k dielectrics, or porous dielectrics. Known suitable deposition techniques, such as, for example, atomic layer deposition (ALD), chemical vapor deposition (CVD), plasma enhanced chemical vapor deposition, spin on deposition, or physical vapor deposition (PVD) may be used to form the $M_x$ dielectric 120 and the $M_{x+1}$ dielectric 220. The $M_x$ dielectric 120 and the $M_{x+1}$ dielectric 220 may each have a thickness ranging from approximately 100 nm to approximately 150 nm and ranges there between, although a thickness less than 100 nm and greater than 150 nm may be acceptable.

With continued reference to FIG. 2A, the $M_x$ metal 130 may be, for example, a typical line, via, or wire found in a typical interconnect structure. The $M_x$ metal 130 may be made of a conductive interconnect material including, for example, copper, aluminum, or tungsten. The conductive interconnect material may be formed using a filling technique such as electroplating, electroless plating, chemical vapor deposition, physical vapor deposition or a combination of methods. The conductive interconnect material may further include a dopant, such as, for example, manganese, magnesium, copper, aluminum, or other known dopants. In some embodiments, various barriers or liners (not shown) may be formed in the $M_x$ level 110 between the $M_x$ metal 130 and the $M_x$ dielectric 120. In one embodiment, a liner may include, for example, a tantalum nitride layer, followed by a tantalum layer. Other barrier liners may include cobalt or ruthenium, either alone or in combination with any other suitable liner. Alternatively, the $M_x$ metal 130 may include the various liners and barriers detailed below in conjunction with FIGS. 2B-2D or in conjunction with FIGS. 4A-4D.

With continued reference to FIG. 2A, the $M_x$ capping layer 140 may include, for example, silicon nitride, silicon carbide, silicon carbon nitride, hydrogenated silicon carbide, or other known capping materials. The $M_x$ capping layer 140 may have a thickness ranging from approximately 20 nm to approximately 60 nm and ranges there between, although a thickness less than 20 nm and greater than 60 nm may be acceptable.

With continued reference to FIG. 2A, the trench 230 may be formed in the $M_{x+1}$ dielectric 220 using typical etching techniques, including, for example, a dual damascene process. In some embodiments, including the depicted embodiment, the trench 230 may extend through the $M_x$ capping layer 140 into the $M_x$ level 110. While the trench 230 as depicted in FIG. 2A includes both a line trench and a via trench, the trench 230 may be shaped to accommodate a variety of metal structures in the $M_{x+1}$ level 210.

At 13, a thin liner layer (not shown) may optionally be formed on the $M_{x+1}$ dielectric 220 in the trench 230. The thin liner layer may include typical interconnect barrier liner layer materials, such as tantalum, tantalum nitride, and combinations thereof or titanium, titanium nitride and combinations thereof. In other embodiments the thin liner layer may be a silicon nitride or SiNCOH layer. In some embodiments, there may be no thin liner layer. Where present, the thin liner layer may have a thickness much less than typical interconnect barrier liner layers. For example, the thin liner layer may have a thickness of less than approximately 10 nm. In another embodiment, the thin liner layer may be a tantalum nitride layer with a thickness of approximately 2 nm, formed by known deposition methods such as CVD or ALD.

Figure 2B:
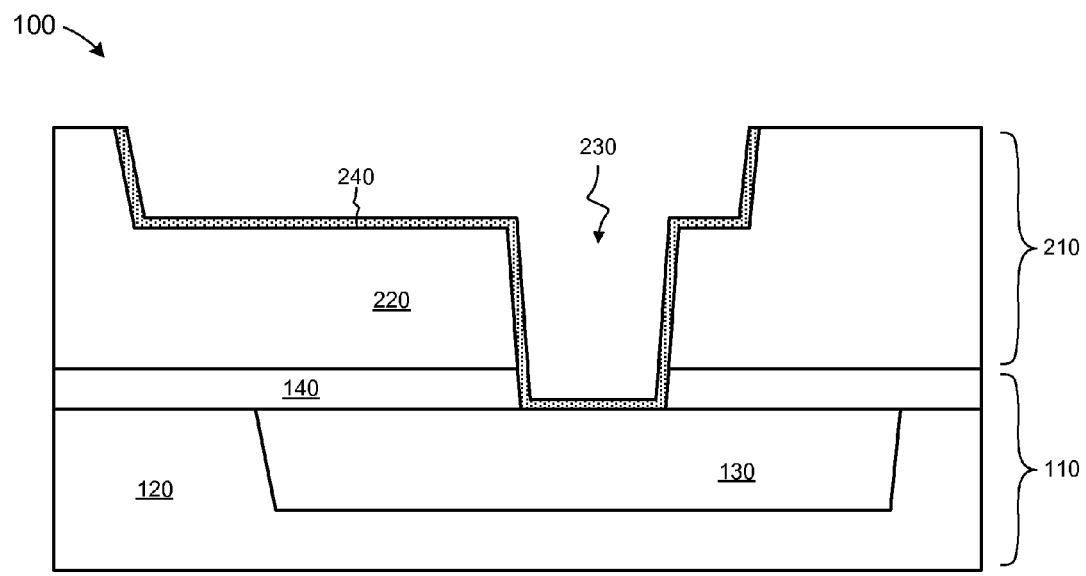
FIG. 2B is a cross-sectional view depicting the formation of a liner in the trench of FIG. 2A, according to an exemplary embodiment of the present invention.

At 15, described in conjunction with FIG. 2B, a main liner 240 may be deposited in the trench 230. The main liner 240 may include both a seed material and a barrier-forming material in one or more layers. The seed material may include cobalt, ruthenium, or some combination thereof. The barrier-forming material may include manganese, aluminum, titanium, or some combination thereof. In a preferred embodiment, the seed material is cobalt and the barrier-forming material is manganese. The main liner 240 may have a thickness of approximately 1 nm to approximately 100 nm and may contain approximately 70% to approximately 99.5% seed material, and approximately 0.05% to approximately 30% barrier-forming material.

With continued reference to FIG. 2B, the main liner 240 may be formed by depositing one or more layers (not shown) using one or more known deposition techniques, including CVD and ALD. Each layer of the main liner 240 may include the seed material, the barrier material, or a mixture of both the seed material and the barrier material. In an exemplary embodiment where the seed material is cobalt and the barrier-forming material is manganese, the main liner 240 may be preferably formed by depositing a first manganese layer using ALD, a first cobalt layer above the first manganese layer using CVD, and a second manganese layer above the first cobalt layer using ALD. In another embodiment, the main liner 240 may be formed by depositing a cobalt layer using CVD and a manganese layer above the cobalt layer using ALD. In another embodiment, the main liner 240 may be formed by simultaneously depositing manganese and cobalt using CVD. In another embodiment, the main liner 240 may be formed by alternating between ALD cobalt layers and ALD manganese layers. Other methods of using ALD and CVD to deposit any number of cobalt, manganese, or cobalt-manganese layers are explicitly contemplated, as well as other seed materials and barrier materials.

Figure 2C:
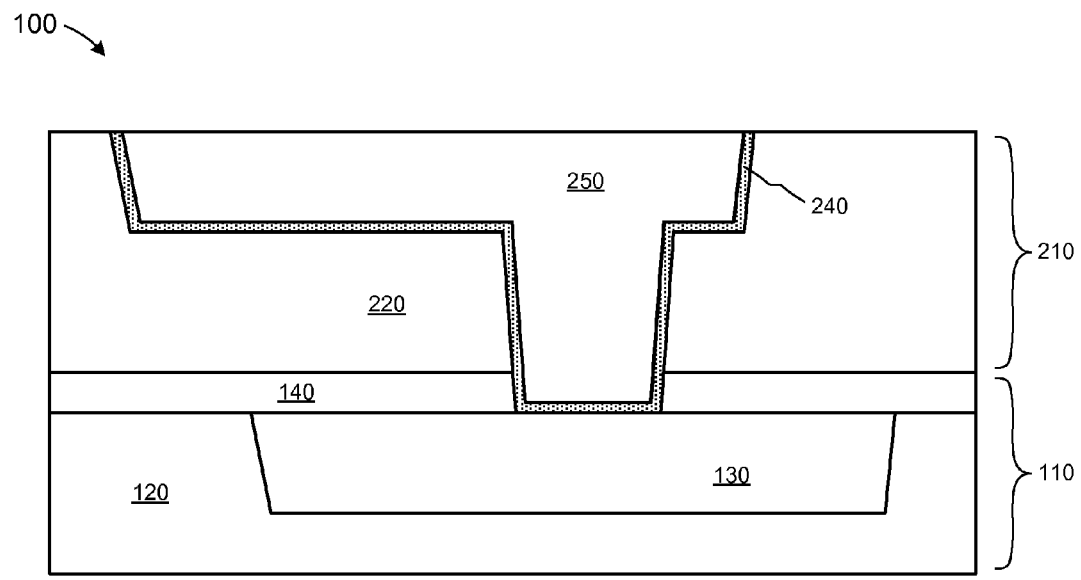
FIG. 2C is a cross-sectional view depicting the formation of an $M_{x+1}$ metal in the trench above the liner of FIG. 2B, according to an exemplary embodiment of the present invention.

At 17, described in conjunction with FIG. 2C, an $M_{x+1}$ metal 250 may be deposited in the trench 230 above the main liner 240. The $M_{x+1}$ metal 250 may be made of a conductive interconnect material, including, for example, copper, aluminum, or tungsten, and may be formed using a filling technique such as electroplating, electroless plating, chemical vapor deposition, physical vapor deposition or a combination of methods. The conductive interconnect material may further include a dopant, such as, for example, manganese (Mn), magnesium (Mg), copper (Cu), aluminum (Al) or other known dopants. In some embodiments, the $M_{x+1}$ metal 250 may be made of the same material and formed by the same processes as the conductive interconnect material of the $M_x$ metal 130. The seed material of the main liner 240 may improve adhesion of the $M_{x+1}$ metal 250 to the main liner 240.

Figure 2D:
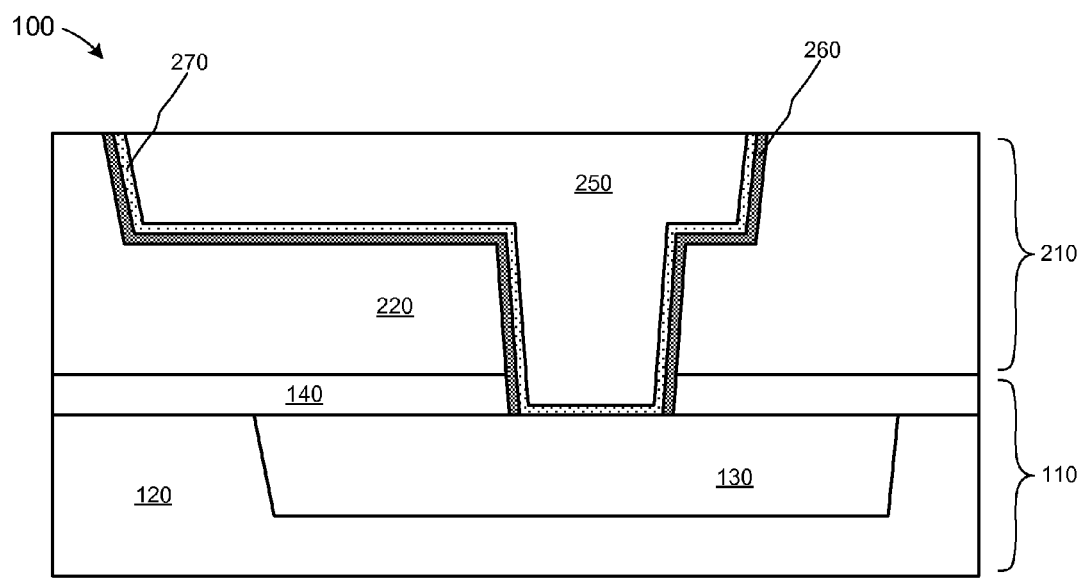
FIG. 2D is a cross-sectional front elevational view depicting the formation of a self-forming barrier between the $M_{x+1}$ dielectric and the $M_{x+1}$ metal of FIG. 2C, according to an exemplary embodiment of the present invention.

At 19, described in conjunction with FIG. 2D, the interconnect structure 100 may be annealed to form a self-formed metal oxide embedded diffusion barrier 260 and a seed alloy region 270. The structure 100 may be annealed at a constant temperature of approximately 200° C. to approximately 400° C. for approximately 0.5 hours to approximately 5 hours. In other embodiments, the temperature may vary throughout the annealing process.

With continued reference to FIG. 2D, the annealing process may cause the barrier-forming material of the main liner 240 (FIG. 1D) to migrate into the $M_{x+1}$ dielectric 220 and the $M_x$ capping layer 140 at the interface between the main liner 240 and the $M_{x+1}$ dielectric 220 and the $M_x$ capping layer 140. The barrier-forming material may react with the material of the $M_{x+1}$ dielectric 220 and the $M_x$ capping layer 140, forming the embedded diffusion barrier 260.

With continued reference to FIG. 2D, in an exemplary embodiment where the barrier-forming material is manganese, the $M_{x+1}$ dielectric 220 and/or the $M_x$ capping layer 140 contain silicon and oxygen, and the embedded diffusion barrier 260 may be made of manganese silicon oxide. The embedded diffusion barrier 260 may have a thickness of approximately 1 nm to approximately 10 nm. Likewise, the self-forming embedded diffusion barrier 260 may be an aluminum silicon oxide, titanium silicon oxide, or combinations thereof depending upon the barrier-forming material used. The embedded diffusion barrier 260 may prevent metal such as copper from diffusing from the $M_{x+1}$ metal 250 to the $M_{x+1}$ dielectric 220 and the $M_x$ capping layer 140 and may further prevent oxygen from diffusing from the $M_{x+1}$ dielectric 220 and the $M_x$ capping layer 140 to the $M_{x+1}$ metal 250, without reducing the total volume of the $M_{x+1}$ metal 250. Therefore, the self-forming barrier 260 may improve the reliability of the structure 100 without increasing the electrical resistance of the $M_{x+1}$ level 210.

With continued reference to FIG. 2D, after the barrier-forming material migrates out of the main liner 240, the remaining seed material forms a seed alloy region 270 between the embedded diffusion barrier 260 and the $M_{x+1}$ metal 250. Because the seed alloy region 270 may adhere to the embedded diffusion barrier 260 and to the $M_{x+1}$ metal 250 better than the embedded diffusion barrier 260 would adhere to the $M_{x+1}$ metal 250, the presence of the seed alloy region 270 improves the overall cohesion of the structure 100. Further, the seed alloy region 270 is present between the $M_x$ metal 130 and $M_{x+1}$ metal 250 and may reduce electromigration, preventing metal from migrating from the $M_x$ metal 130 to the $M_{x+1}$ metal 250 or vice versa.

Figure 3:
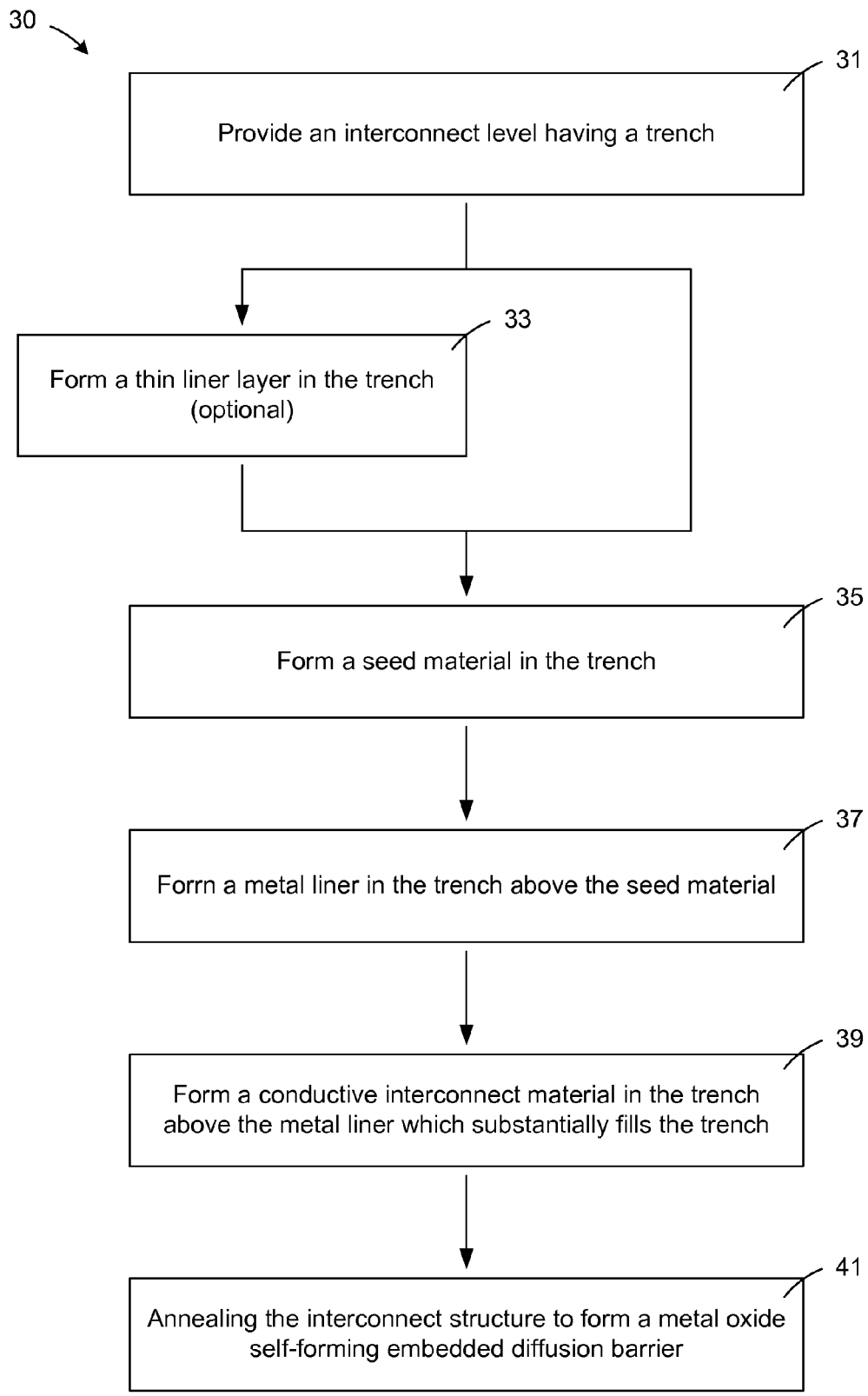
FIG. 3 flow chart of a method of creating a self-forming diffusion barrier, according to an exemplary embodiment of the present invention.

FIG. 3 is a flow chart of a method of forming an embedded diffusion barrier, according to an embodiment of the present invention. Referring to FIG. 3, the method 30 includes a step 31, providing an interconnect structure having a trench; an optional step 33, forming a thin liner layer in the trench; a step 35, forming a seed material in the trench; a step 37, forming a metal liner in the trench above the seed material, a step 39, forming a conductor layer in the trench above the main liner which substantially fills the trench; and a step 41, annealing the interconnect structure to form a metal oxide self-forming embedded diffusion barrier. Steps of the method embodied in FIG. 3 are depicted in FIG. 2A and FIGS. 4A-4D.

At 31, the interconnect structure 100 described above in conjunction with FIG. 2A may be provided.

At 33, a thin liner layer (not shown) may be formed on the $M_{x+1}$ dielectric 220 in the trench 230. The thin liner layer may include typical interconnect barrier liner layer materials, such as tantalum, tantalum nitride, and combinations thereof or titanium, titanium nitride and combinations thereof. In other embodiments the thin liner layer may be a silicon nitride or SiNCOH layer. In some embodiments, there may be no thin liner layer. Where present, the thin liner layer may a thickness much less than typical interconnect barrier liner layers. For example, the thin liner layer may have a thickness of less than approximately 10 nm. In another embodiment, the thin liner layer may be a tantalum nitride layer with a thickness of approximately 2 nm, formed by known deposition methods such as CVD or ALD.

Figure 4A:
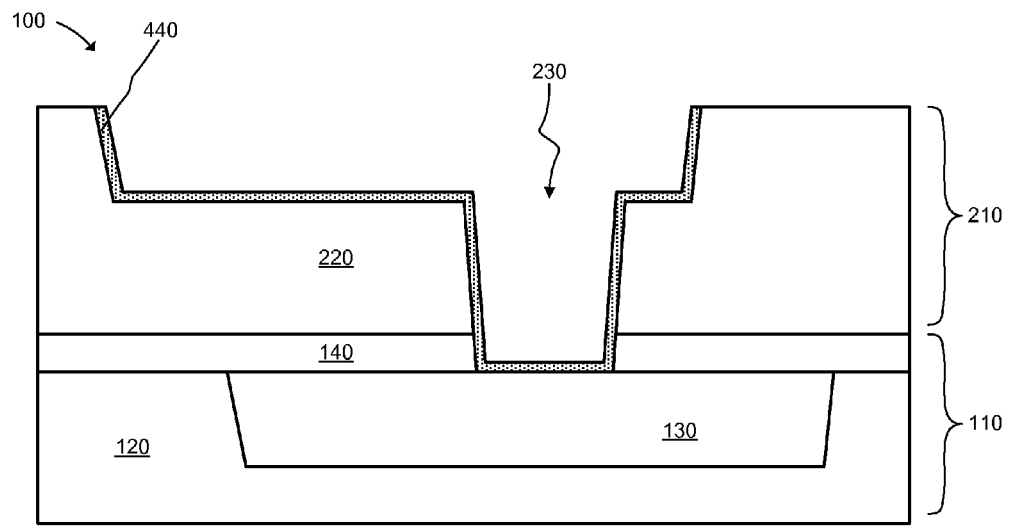
FIG. 4A is a cross-sectional view depicting the formation of a seed layer in the trench of FIG. 2A, according to an exemplary embodiment of the present invention.

At 35, described in conjunction with FIG. 4A, a seed material 440 may be formed in the trench 230. The seed material 440 may be made of the same material as the seed material of the main liner 240 (FIG. 2B), for example, cobalt, ruthenium, or some combination thereof, and may have a thickness of approximately 1 nm to approximately 100 nm. In a preferred embodiment, the seed material 440 is a cobalt layer having a thickness of approximately 2 nm. The seed liner 440 may be formed using one or more known deposition techniques, including CVD and ALD.

Figure 4B:
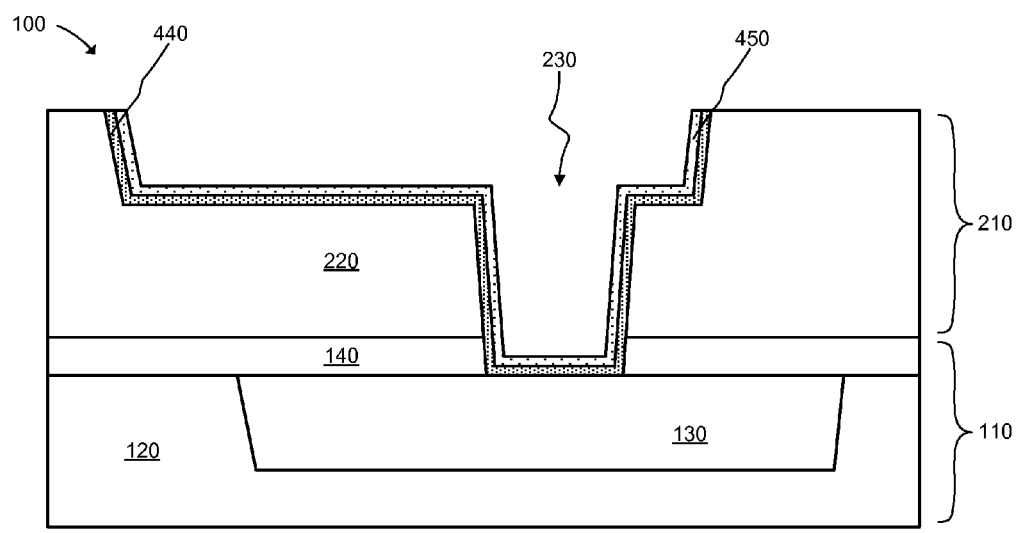
FIG. 4B is a cross-sectional view depicting the formation of a barrier-forming layer in the trench above the seed layer of FIG. 4A, according to an exemplary embodiment of the present invention.

At 37, described in conjunction with FIG. 4B, a metal liner 450 may be formed in the trench 230 above the seed material 440. The metal liner 450 may include any conductive interconnect material suitable for forming a BEOL metal structure, including, for example, copper, aluminum, or tungsten, and a barrier-forming material. The barrier-forming material may be made of the same material as the barrier-forming material of the liner 240 (FIG. 1C) including, for example, manganese, aluminum, titanium, or some combination thereof. The metal liner 450 may contain approximately 0.5% to approximately 30% barrier-forming material. The metal liner 450 may be formed by known deposition methods such as CVD or ALD and have a thickness of approximately 1 nm to approximately 100 nm.

In an exemplary embodiment, the metal liner 450 may be an approximately 20 nm thick copper layer containing approximately 2% manganese.

Figure 4C:
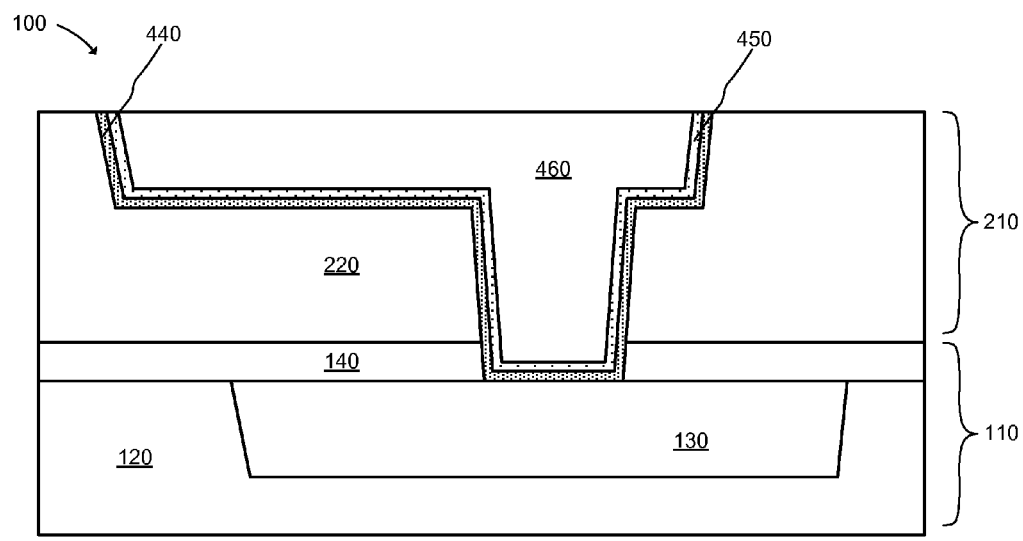
FIG. 4C is a cross-sectional view depicting the formation of an $M_{x+1}$ metal in the trench above the barrier-forming layer of FIG. 4B, according to an exemplary embodiment of the present invention.

At 39, described in conjunction with FIG. 4C, an $M_{x+1}$ metal 460 may be deposited in the trench 230 above the metal liner 450. The $M_{x+1}$ metal 460 may be made of substantially the same materials and formed by substantially the same methods as the $M_{x+1}$ metal 250. In some embodiments, the $M_{x+1}$ metal 460 may be made of the same material as the conductive interconnect material of the metal liner 450.

Figure 4D:
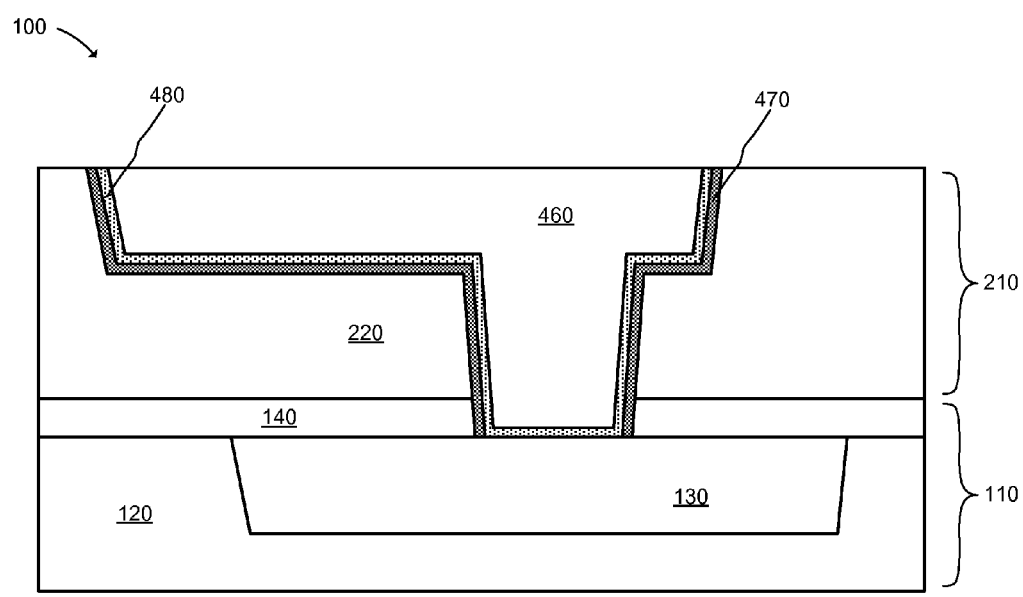
FIG. 4D is a cross-sectional view depicting the formation of a self-forming barrier between the $M_{x+1}$ dielectric and the $M_{x+1}$ metal of FIG. 4C, according to an exemplary embodiment of the present invention.

At 41, described in conjunction with FIG. 4D, the interconnect structure 100 may be annealed to form a self-formed metal oxide embedded diffusion barrier 470 and a seed alloy region 480. The interconnect structure 100 may be annealed at a constant temperature of approximately 200° C. to approximately 400° C. for approximately 0.5 hours to approximately 5 hours. In other embodiments, the temperature may vary throughout the annealing process.

With continued reference to FIG. 4D, the annealing process may cause the barrier-forming material of the metal liner 450 to migrate into the $M_{x+1}$ dielectric 220 and the $M_x$ capping layer 140 at the interface between the main liner 240 and the $M_{x+1}$ dielectric 220 and the $M_x$ capping layer 140. The barrier-forming material may react with the material of the $M_{x+1}$ dielectric 220 and the $M_x$ capping layer 140, forming the embedded diffusion barrier 470.

With continued reference to FIG. 4D, in an exemplary embodiment where the barrier-forming material is manganese and the $M_{x+1}$ dielectric 220 and/or the $M_x$ capping layer 140 contain silicon and oxygen, the embedded diffusion barrier 470 may be made of manganese silicon oxide. The embedded diffusion barrier 470 may have a thickness of approximately 1 nm to approximately 10 nm. Likewise, the self-forming embedded diffusion barrier may be an aluminum silicon oxide, titanium silicon oxide, or combinations thereof depending upon the barrier-forming material used. The embedded diffusion barrier 470 may prevent metal such as copper from diffusing from the $M_{x+1}$ metal 250 to the $M_{x+1}$ dielectric 220 and the $M_x$ capping layer 140, and may further prevent oxygen from diffusing from the $M_{x+1}$ dielectric 220 and the $M_x$ capping layer 140 to the $M_{x+1}$ metal 460, without reducing the total volume of the $M_{x+1}$ metal 460. Therefore, the self-forming barrier 470 may improve the reliability of the structure 100 without increasing the electrical resistance of the $M_{x+1}$ level 210.

With continued reference to FIG. 4D, after the formation of the embedded diffusion barrier 470, the seed material 440 may remain in place and form a seed alloy region 480 between the embedded diffusion barrier 470 and the $M_{x+1}$ metal 460. Because the seed alloy region 480 may adhere to the embedded diffusion barrier 470 and to the $M_{x+1}$ metal 460 better than the embedded diffusion barrier 470 would adhere to the $M_{x+1}$ metal 460, the presence of the seed alloy region 480 improves the overall cohesion of the structure 100. Further, the seed alloy region 480 is present between the $M_x$ metal 130 and $M_{x+1}$ metal 460 and may reduce electromigration, preventing metal from migrating from the $M_x$ metal 130 to the $M_{x+1}$ metal 460 or vice versa.

Figure 5A:
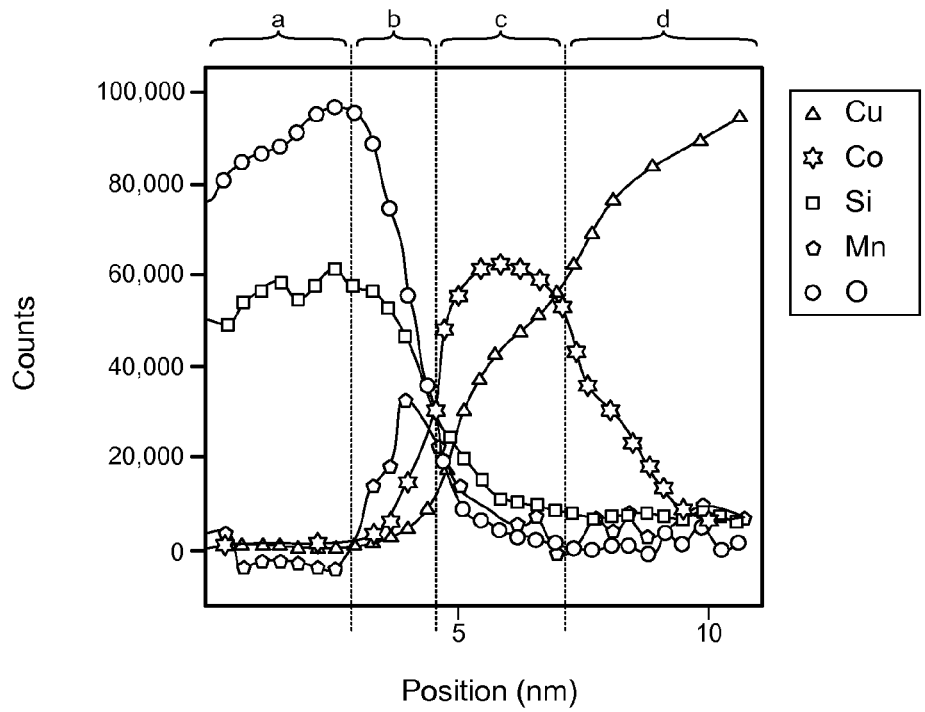
FIG. 5A is a graph depicting the results of an energy-dispersive x-ray spectroscopy (EDX)/electron energy loss spectroscopy (EELS) scan of a structure embodiment of the present invention.

FIG. 5A is a graph depicting the results of an energy-dispersive x-ray spectroscopy (EDX)/electron energy loss spectroscopy (EELS) of a structure embodiment of the present invention. The graph depicts, from left to right, a silicon-oxygen region a, corresponding to the $M_{x+1}$ dielectric 220, a silicon-oxygen-manganese region b, corresponding to the embedded diffusion barrier 470, a cobalt region c, corresponding to the seed alloy region 480, and a copper region d, corresponding to the $M_{x+1}$ metal 460. It should be noted that there is not necessarily a distinct shift in atomic concentration from one level to the other. For example, as seen in FIG. 5A, the annealing process may result in some amount of the $M_{x+1}$ metal 250 migrating into the seed alloy region 480 as evidenced by the presence of copper in the cobalt region c.

Figure 5B:
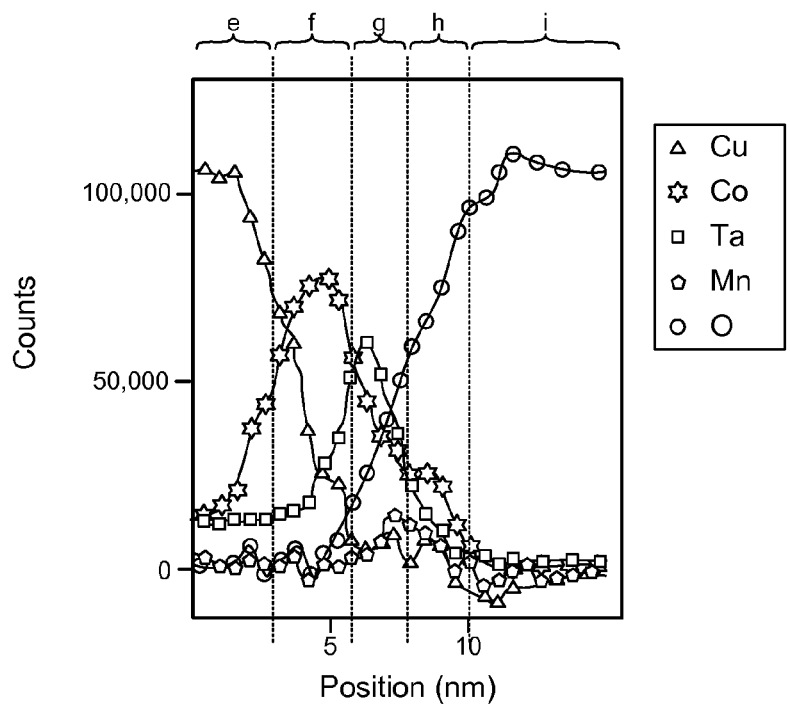
FIG. 5B is a graph depicting the results of an EDX/EELS scan of a structure embodiment of the present invention having a thin liner layer.

FIG. 5B is a graph depicting the results of EDX/EELS scan of a structure embodiment of the present invention including the thin liner layer discussed above at 30. The graph depicts, from left to right, a copper region e, corresponding to the $M_{x+1}$ metal 460, a cobalt region f, corresponding to the seed alloy region 480, a tantalum region g, corresponding to the thin liner layer, a manganese-oxygen region h, corresponding to the embedded diffusion barrier 470, and oxygen region i, corresponding to the $M_{x+1}$ dielectric 220. It should be noted that there is not necessarily a distinct shift in atomic concentration from one level to the other. For example, the embedded diffusion barrier 470 may contain some amount of the seed material, as evidenced by the presence of cobalt in the manganese-oxygen region h.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein. It is therefore intended that the present invention not be limited to the exact forms and details described and illustrated but fall within the scope of the appended claims.

What is claimed is:

1. An interconnect structure consisting of:
    an $M_x$ level including an $M_x$ metal in an $M_x$ dielectric;
    an $M_{x+1}$ level above the $M_x$ level including an $M_{x+1}$ metal in an $M_{x+1}$ dielectric;
    an embedded diffusion barrier located between the $M_{x+1}$ dielectric and the $M_{x+1}$ metal, wherein the embedded diffusion barrier comprises a metal oxide from the $M_{x+1}$ dielectric and a barrier metal; and
    a seed alloy region, wherein a portion of the seed alloy region is located between the $M_{x+1}$ metal and $M_{x+1}$ dielectric, and another portion of the seed alloy region is located between the $M_{x+1}$ metal and the $M_x$ metal, and wherein the seed alloy comprises cobalt.

2. The interconnect structure of claim 1, wherein the barrier metal is selected from the group consisting of manganese, aluminum, titanium, or some combination thereof.

3. The interconnect structure of claim 1, wherein the embedded diffusion barrier comprises a metal oxide and one or more of the group consisting of cobalt and ruthenium.

4. The interconnect structure of claim 1, wherein the seed alloy has a thickness of approximately 1 nm to approximately 10 nm.

5. The interconnect structure of claim 1, wherein the embedded diffusion barrier has a thickness of approximately 1 nm to approximately 10 nm.

\* \* \* \* \*